United States Patent [19]

Nulman

[11] Patent Number: 5,288,665
[45] Date of Patent: Feb. 22, 1994

[54] PROCESS FOR FORMING LOW RESISTANCE ALUMINUM PLUG IN VIA ELECTRICALLY CONNECTED TO OVERLYING PATTERNED METAL LAYER FOR INTEGRATED CIRCUIT STRUCTURES

[75] Inventor: Jaim Nulman, Palo Alto, Calif.

[73] Assignee: Applied Materials, Inc., Santa Clara, Calif.

[21] Appl. No.: 928,813

[22] Filed: Aug. 12, 1992

[51] Int. Cl.$^5$ .................... H01L 21/44; H01L 21/48
[52] U.S. Cl. ................... 437/194; 437/195; 437/246
[58] Field of Search .................. 437/195, 194, 246

[56] References Cited

U.S. PATENT DOCUMENTS

| 4,619,887 | 10/1986 | Hooper | 430/313 |
| 4,879,257 | 11/1989 | Patrick | 437/195 |
| 5,026,666 | 6/1991 | Hills et al. | 437/195 |
| 5,108,951 | 4/1992 | Chen et al. | 437/194 |
| 5,124,780 | 6/1992 | Sandhu | 357/67 |

OTHER PUBLICATIONS

Wolf, Silicon Processing for the VLSI Era, vol. 2, published by Lattice Press, 1990.

Primary Examiner—Olik Chaudhuri
Assistant Examiner—H. Jey Tsai
Attorney, Agent, or Firm—John P. Taylor

[57] ABSTRACT

A process is described for forming an aluminum plug in a via in an insulating layer in an integrated circuit structure by first depositing a layer of aluminum over the insulating layer in a multistep deposition which will also result in filling the via with aluminum to form an aluminum plug therein, followed by removal of any additional aluminum formed over the surface of the insulating layer, and subsequent formation of one or more patterned conductive layers over the insulating surface which is in electrical communication with the underlying aluminum plug in the via. The one or more patterned conductive layers formed over the insulating surface are characterized by superior electrical properties over the aluminum layer initially deposited and then removed. A barrier layer may be first formed over exposed portions of the underlying integrated circuit structure at the bottom of the via before it is filled with aluminum.

17 Claims, 2 Drawing Sheets

```
┌─────────────────────────────────┐
│ PROVIDING AN INSULATING LAYER   │
│ HAVING ONE OR MORE VIAS TO      │
│ UNDERLYING PORTIONS OF AN       │
│ INTEGRATED CIRCUIT STRUCTURE    │
└─────────────────────────────────┘
                │
┌─────────────────────────────────┐
│ SPUTTERING ALUMINUM OVER THE    │
│ INSULATING LAYER AND INTO THE   │
│ VIAS UTILIZING A DEPOSITION     │
│ TEMPERATURE OF AT LEAST 400°C   │
└─────────────────────────────────┘
                │
┌─────────────────────────────────┐
│ REMOVING THE ALUMINUM ON THE    │
│ SURFACE OF THE INSULATING       │
│ LAYER LEAVING ALUMINUM PLUGS    │
│ IN THE VIAS                     │
└─────────────────────────────────┘
                │
┌─────────────────────────────────┐
│ FORMING, AT A TEMPERATURE BELOW │
│ 350°C, A PATTERNED CONDUCTIVE   │
│ LAYER OVER THE INSULATING LAYER │
│ AND THE VIAS IN ELECTRICAL      │
│ COMMUNICATION WITH THE ALUMINUM │
│ PLUGS IN THE VIAS               │
└─────────────────────────────────┘
```

FIG. 1

PROCESS FOR FORMING LOW RESISTANCE ALUMINUM PLUG IN VIA ELECTRICALLY CONNECTED TO OVERLYING PATTERNED METAL LAYER FOR INTEGRATED CIRCUIT STRUCTURES

BACKGROUND OF THE INVENTION

1. Field of the Invention

This invention relates to a process for forming, in one or more vias in an insulating layer of an integrated circuit structure, an aluminum plug; and then forming a patterned metal layer over the insulating layer in electrical communication with the aluminum plug.

2. Description of the Related Art

Aluminum has been used f or a number of years as interconnect material, as well as a filler material for vias in an insulating layer to provide electrical communication to either another metal interconnect layer or to underlying integrated circuit structure, e.g., between different levels of interconnects or to contacts of an active device such as a bipolar or MOS transistor.

However, the problem of spiking, which occurs when silicon migrates into the aluminum, has led to the use of an electrically conductive barrier layer in the via, such as a refractory metal which is formed over exposed portions of underlying silicon at the bottom of the via. However this further reduces the size of the via, making it more difficult to fill the remainder of the via volume with aluminum, especially with the concurrent reduction in the geometries of integrated circuit structures. This, in turn, has led to the use of other filler materials such as tungsten to fill the vias.

However, while tungsten can be used successfully as a via filler material, it has a higher electrical resistance than aluminum, making it less desirable as a filler material and/or as an overlying metal interconnect layer.

In view of such less than satisfactory results with the use of tungsten in filling vias, there has been renewed interest in the use of aluminum as a filler material for vias, leading to the development of CVD or sputter deposition processes wherein at least a part of the deposition is carried out at temperatures of at least 400° C. or higher.

While the use of such higher deposition temperatures has resulted in the satisfactory filling of such vias with aluminum,, the resulting aluminum layer concurrently formed over the insulation layer containing the vias may not be satisfactory for use in forming a patterned interconnect. Such high temperature-deposited aluminum layers have been found to have electro migration and stress migration limitations. Furthermore., the resulting large grains formed in the aluminum deposited at such high temperatures interferes with subsequent patterning and line etching of the aluminum layer resulting in poor line definition.

It would, therefore, be desirable to provide a process for filling a via in an insulating layer of an integrated circuit structure with an aluminum plug followed by formation of a patternable conductive metal layer over the insulation layer to provide an electrical connection to the aluminum plug in the via.

SUMMARY OF THE INVENTION

The invention comprises a process for forming an aluminum plug in a via in an insulating layer in an integrated circuit structure with a patternable conductive layer over the insulating layer and in electrical communication with the aluminum plug by first depositing a layer of aluminum over the insulating layer which will also fill the via, followed by removal of any additional aluminum formed on the surface of the insulating layer, and subsequent formation of a patternable conductive layer over the insulating surface in electrical communication with the underlying aluminum plug in the via.

These and other aspects of the invention will be apparent from the following description and accompanying drawings.

BRIEF DESCRIPTION OF THE DRAWINGS

FIG. 1 is a flow sheet illustrating the process of the invention.

DETAILED DESCRIPTION OF THE INVENTION

The invention comprises a multiple step process for forming an integrated circuit structure comprising aluminum deposited in one or more vias in an insulating layer and electrically coupled to a patternable metal layer over the insulating layer.

The process comprises first depositing aluminum over an insulating layer containing one or more vias, in one or more deposition phases utilizing deposition temperatures of 400° C. or higher. The second step comprises removal of aluminum, deposited in the first step, from the surface of the insulating layer while leaving aluminum plugs in the vias. The third step comprises forming a patternable conductive layer or layers over the insulating layer having superior electrical properties to the aluminum layer deposited in the first step. The patternable conductive layer is deposited utilizing temperatures of 350° C. or less resulting in a conductive layer having better electro migration resistance, stress migration resistance, and small grain size than the aluminum deposited in the first step.

Figure 2:
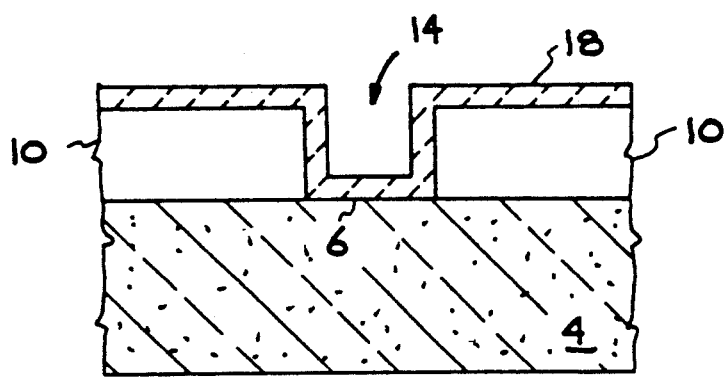
FIG. 2 is a vertical cross-sectional view of a prior art integrated circuit structure including an insulating layer and a via formed therein

Turning now to FIG. 2, after the formation of an insulating layer 10 on an integrated circuit structure 4, which may comprise an insulating layer formed over active and/or passive devices, or an insulating layer formed over an existing metal interconnect layer, one or more vias 14 are conventionally formed in insulating layer 10 to provide communication with underlying structure 4.

An optional barrier layer 18 may then be formed over exposed underlying portions 6 of integrated circuit structure 4, as also shown in FIG. 2, such as a layer of titanium nitride or titanium/tungsten, formed directly over the exposed structure which will provide a barrier layer between underlying structure 6 and the aluminum filler material to be deposited in via 14. Further materials (not shown) may also be deposited at this point to promote superior adherence of the deposited aluminum to the sidewalls of the via, as is well known to those skilled in the art and which forms no part of the present invention.

Figure 3:
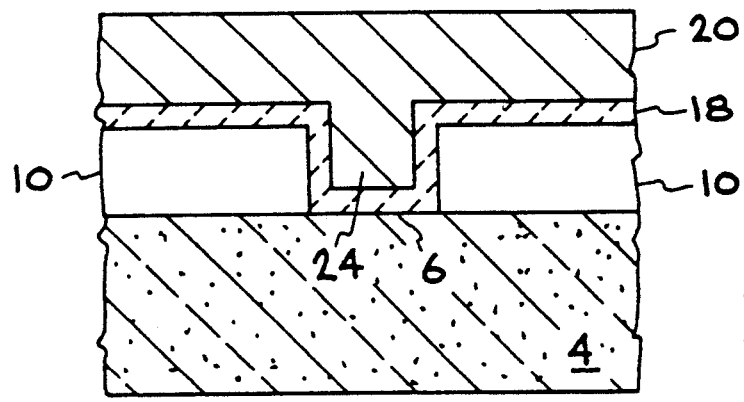
FIG. 3 is a vertical cross-sectional view of the integrated circuit structure of FIG. 2 after the first step of depositing aluminum to f ill the via with an aluminum plug and form a layer of aluminum over the insulation layer.

A. Aluminum Deposition Step to Fill Vias With Aluminum Plugs and Form Aluminum Layer over Insulating Layer After formation of optional barrier layer 18 over exposed underlying integrated circuit structure at the bottom of the vias, aluminum layer 20, used to form aluminum filler plugs 24, is then deposited, as shown in FIG. 3.

The aluminum layer deposited in this first step of the process of the invention to fill the vias may be pure aluminum, e.g., 99.9+ wt.% aluminum, or it may comprise an aluminum alloy containing up to about 4 wt.% silicon or up to about 6 wt.% copper or a mixture of both within these specified limits. It will, therefore, be understood that the use of the term "aluminum" herein is intended to include both pure aluminum and aluminum alloyed with either silicon or copper or both within the limits described.

The aluminum deposition used to form aluminum filler plugs 24 in vias 14 is preferably deposited by a sputter deposition process at a high temperature, i.e., at least about 400° C. or higher; although a high temperature CVD process can also be used. However, a sputter deposition is preferred over CVD because of the inability of a CVD process to provide desired doping of the aluminum plugs with dopant materials such as copper during the aluminum deposition.

Thus, it will be understood that while the following description of a multiple phase sputter deposition step to form aluminum plugs 24 in vias 14 comprises the best mode of carrying out the first step of the process, aluminum plugs 24 may also be formed by other aluminum deposition processes, as long as the resulting deposited aluminum completely fills the via.

It should also be noted that the hereinafter described multiple phase aluminum sputter deposition may be carried out either in the same chamber or in more than one chamber. The use of a single chamber for all of the aluminum deposition phases is preferred to avoid contaminating the wafer during movement of the wafer from one chamber to another. For example, contamination such as oxidation (to form aluminum oxide) may be inhibited when using a single chamber by actually continuing to deposit aluminum on the wafer as the deposition parameters are changed from one phase to another. In contrast a vacuum would need to be used during the transfer from one chamber to another to avoid the occurrence of contamination during such interruption of the deposition process.

The preferred multiphase aluminum sputtering process step used to form the desired aluminum plugs may be carried out by first sputtering aluminum onto the wafer surf ace f or a period of time which may vary from about 0.1 to about 3.0 minutes (from about 6 to about 180 seconds), and typically comprises about 0.5 minutes (about 30 seconds).

The target power supply during this first deposition phase is preferably set at a voltage of about −300 to about −600 volts, more preferably from about −450 to about −550 volts, and most preferably about −500 volts; and at a power level sufficient to provide a deposition rate of from about 200 to about 300 Angstroms per second. For a 6" diameter wafer, for example, such a deposition rate made be maintained using a power level of from about 9 kilowatt to about 17 kilowatts, typically about 10 kilowatts during the first deposition phase.

This time period and deposition rate is sufficient to form an initial aluminum layer having a thickness ranging from about 1000 to about 3000 Angstroms in thickness, typically about 2000 Angstroms.

During this first phase of the first deposition step, the temperature of the wafer is maintained at less than about 200° C. When all of the phases of this aluminum deposition step are carried out in the same deposition chamber, a support and heating platform may be preheated to a higher temperature (for carrying out one or more subsequent deposition steps), but spaced away from the wafer, e.g., by not raising the platform (which contains the heater) into a position where it will contact the wafer during the first deposition phase.

The pressure within the sputtering chamber, during this first sputtering phase, as well as throughout the remainder of this first deposition step, is maintained within a range of from about 0.1 millitorr to about 8 millitorr while a sputtering gas such as argon is flowed into the sputtering chamber at a rate of from about 15 standard cubic centimeters/minute (sccm) to about 300 sccm.

The second phase of the aluminum deposition step is then carried out, preferably in the same deposition chamber, with the maximum wafer temperature maintained at a level of from at least about 400° C. to about 600° C. Preferably, to ensure proper filling of the vias, the deposition temperature during this second phase of H first deposition step will preferably range from over 450° C. to about 500° C.

The wafer temperature is raised during this second phase of the first deposition step and then maintained within the desired temperature of not exceeding about 600° C., i.e. within a range of from about 400° C. to about 600° C., by flowing a thermally conductive gas such as argon into a sealed region formed between the wafer and the surface of the preheated platform. This thermally couples the wafer to the preheated platform and heater to thereby limit further increases in the wafer temperature. By preheating the platform and heater prior to this second phase of the deposition step, a time delay (of waiting for the heater and wafer to warm up to the second and higher deposition temperature) may be avoided, which is an additional advantage for using the same chamber for all the phases of this first aluminum deposition step used in forming the aluminum filler plug.

A lower target power level is used in the second phase to provide a deposition rate of from about 20 to about 40 Angstroms. For example, for a 6" wafer, the power level will range from about 1 kilowatt up to about 3 kilowatts, and typically will be about 2 kilowatts, during this second phase of the deposition step.

This second phase of the deposition may be carried out in the deposition chamber for a period of from about 0.1 to 10 minutes (from about 6 to about 600 seconds), preferably f rom about 0.7 to about 3.0 minutes (from about 42 to about 180 seconds). This results in the further deposition of from about 1000 to about 6000 Angstroms of additional aluminum, typically about 4000

Angstroms, which is sputtered onto the wafer over the previously deposited aluminum.

When the second phase of this initial deposition step of the invention has been terminated, the third deposition phase may be commenced, which may comprise a further deposition of at least about 3000 Angstroms of additional aluminum onto the wafer surface, using a higher target power level. This third phase of the deposition step may be carried out for a period of from about 0.3 to about 0.4 minutes (from about 18 to about 24 seconds), or until a total deposit thickness of from about 0.6 to 2 micrometers is reached, still using the same deposition chamber, to deposit additional aluminum using a target power level sufficient to provide a deposition rate of from about 100 Angstroms per second to about 250 Angstroms per second. For a 6" wafer, for example, the power level will range from about 4 to about 17 kilowatts, and typically will be about 9 kilowatts.

The wafer temperature may be maintained during this third phase of the deposition step at the same level as during the second phase, i.e. at a level of from at least about 400° C. to about 600° C., and preferably from over 450° C. to about 500° C., with the maximum wafer temperature not exceeding about 600° C. if need be, the power level may be reduced during this third phase of the first deposition step to maintain the wafer temperature within the recited temperature limits.

With respect to the deposition of aluminum during the third phase, the minimum total amount of aluminum to be sputtered over the wafer will depend to some extent on the cross-sectional size and depth of the vias in the underlying insulating layer. The minimum total thickness of the deposited aluminum layer should be at least 100%, and preferably from over 100 up to about 200%, of the depth of the via in the insulating layer to ensure that the via is completely filled with aluminum.

Using the above procedure, an aluminum layer is deposited, which may have an average thickness of at least about 0.3 to about 2 microns, and usually averaging about 1.0 micron, over the highest portions of the underlying insulating layer and will substantially completely fill any vias in the insulating layer. However, it will be understood that should the underlying insulation layer be thicker than about 1 micron, i.e., the depth of the vias exceeds 1 micron, the time of the third deposition step may be extended accordingly.

B. Removal of Aluminum Layer Deposited Over Insulating Layer

The foregoing aluminum deposition provides satisfactory filling of the vias with aluminum, i.e.,, forms electrically conductive aluminum plugs in the vias in the insulating layer. However, the aluminum deposited on the surfaces which could be patterned to form an overlying aluminum interconnect over the insulating layer, when deposited by the foregoing process, does not always provide a satisfactory aluminum layer patternable into an interconnect because,, as previously discussed, its grain and layered structure may not be compatible with the current density requirements of the semiconductor integrated circuit, resulting in aluminum electro migration, and hence open circuits, as well as poor line definition of the patterned conductive layer due to the large grains produced in the deposited aluminum at the higher deposition temperatures,, i.e., at temperatures of 400° C. or higher.

Figure 4:
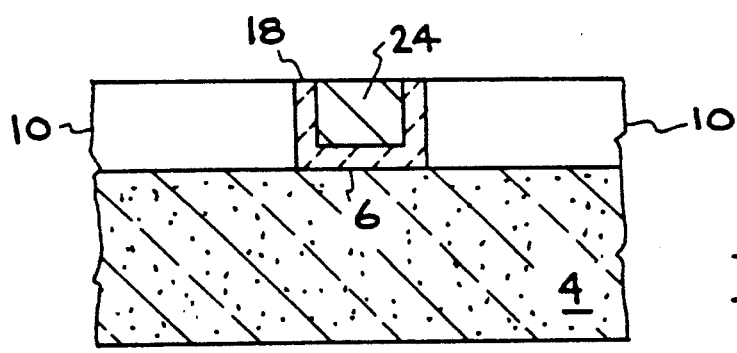
FIG. 4 is a vertical cross-sectional view of the integrated circuit structure of FIG. 3 after the second step of removing the layer of aluminum deposited over the insulation layer, while leaving the aluminum plug in the via.

Therefore, in accordance with the invention, as shown in FIG. 4, surface layer 20 of aluminum deposited over insulating layer 10 is removed, leaving only aluminum plugs 24 in vias 14 in preparation for the subsequent deposition on insulating layer 10 of a patternable metal layer having superior electrical properties.

The previously deposited aluminum layer may be removed by a wet etch such as a wet etch based on chlorine chemistry or by a mechanical polishing process. Preferably, however, the aluminum, as well as underlying refractory metal and/or barrier layer, is removed in a dry etching process, such as a reactive ion etching (RIE) process which is preferably carried out in a vacuum chamber integrated into the same vacuum apparatus used for the deposition.

The aluminum layer is removed in the dry etching chamber using chlorinated chemistry with a plasma driven into the wafer surface. For example, $BCl_3$, at a flow rate between 5 sccm and 100 sccm, typically 30 sccm, may be flowed into the etch chamber while maintaining a plasma therein at a power level of 1 to 5 KW, preferably about 3 KW.

The aluminum layer and barrier layer (if present) are etched back to the underlying insulating layer, e.g., silicon oxide or silicon nitride layer, which acts as an etch stop for the etch system.

C. Deposition Step to Form Patternable Conductive Layer(s) Over Insulating Layer After removal of the initially deposited aluminum layer over the insulating layer, one or more layers of conductive material patternable into an interconnect may be formed over the insulating layer and filled vias, forming an electrically conductive path to the underlying aluminum plugs in the vias in the insulating layer.

Figure 5:
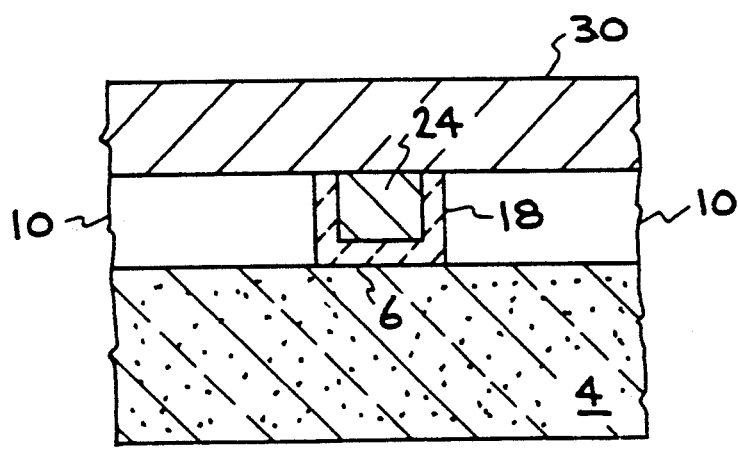
FIG. 5 is a vertical cross-sectional view of the integrated circuit structure of FIG. 4 after the third step of depositing a patternable conductive layer over the insulation layer which is in electrical contact with the underlying aluminum plug in the via.

This patternable conductive layer, shown in FIG. 5 as single layer 30 formed over insulating layer 10, may comprise a single layer of metal or a metal compound such as, for example, aluminum, copper, a refractory metal, a combination of such metals such as titanium-tungsten, or a conductive metal compound such as titanium nitride. When aluminum comprises the patternable conductive layer, it may be deposited either by CVD or sputter deposition, but the deposition temperature should be less than about 350° C. to avoid the previously discussed problems which characterized the earlier aluminum deposition process used in filling the vias with aluminum.

The patternable conductive layer may also comprise a multiple or sandwich layer structure such as, for example, a sandwich or composite comprising a titanium nitride first layer, an aluminum middle layer and a titanium nitride third layer; or the composite might comprise a titanium metal first layer, an aluminum middle layer, and a titanium nitride third layer. Preferably, from a standpoint of device requirements, the conductive layer will usually comprise either a single aluminum layer or a composite layer comprising a refractory metal or refractory metal compound first layer, an aluminum middle layer, and a refractory metal or refractory metal compound as the third layer. The total thickness of the patternable conductive layer, whether comprising a single layer or a composite layer, will usually be at least about 0.2 microns, but will usually not exceed about 2.0 microns.

The patternable conductive layer may be deposited by a sputter deposition process or a CVD process. The conductive layer will be deposited at a temperature optimum for each type of film, but typically lower than 350° C., particularly when aluminum is deposited.

After formation of the patternable conductive layer, the conductive layer may be conventionally patterned, for example, by forming a resist mask over the conductive layer followed by etching the conductive layer through the resist mask, using conventional wet or dry etching techniques such as are well known to those skilled in the art, and then removing the resist mask.

Thus, the process of the invention provides an improved multistep method for forming a low resistance aluminum plug in a via formed in an insulating layer in an integrated circuit structure, and a patternable conductive layer over the insulating layer and in electrical communication with the aluminum plug, wherein the patternable conductive layer is characterized by high electro migration resistance, high stress migration resistance, and good line definition due to the small grain size of the deposited patternable conductive layer due to the lower deposition temperature utilized.

Having thus described the invention what is claimed is:

1. A process for forming a low resistive aluminum plug in a via in an insulating layer of an integrated circuit structure and a patterned conductive layer over said insulating layer and electrically connected to said aluminum plug which comprises:
   a) providing an insulating layer having one or more vias therein to underlying portions of said integrated circuit structure;
   b) depositing sufficient aluminum over said structure to fill said one or more vias with aluminum plugs and to form an aluminum layer over said insulating layer, utilizing a deposition temperature of at least 400° C. or higher for at least a portion of the aluminum deposition;
   c) removing said aluminum layer from said surface of said insulating layer, while leaving said aluminum plugs in said one or more vias; and
   d) forming one or more patternable conductive layers over said insulating layer and said one or more vias, and electrically connected to said aluminum plugs, including depositing a layer of aluminum at a temperature of less than 350° C.

2. The process of claim 1 wherein said step of forming said one or more patternable conductive layers over said insulating layer further comprises forming at least two patternable conductive layers over said insulating layer.

3. The process of claim 1, wherein said step of forming said one or moret- patternable conductive layers over said insulating layer further comprises the steps of:
   (a) forming a first conductive layer over said insulating layer;
   (b) depositing a layer of aluminum over said first conductive layer at a deposition temperature of less than 350° C.; and
   (c) forming a third conductive layer over said aluminum layer.

4. The process of claim 1 wherein said step of depositing sufficient aluminum over said structure to fill said one or more vias with aluminum plugs and to form an aluminum layer over said insulating layer further comprises using an aluminum deposition temperature of at least about 450° C.; and said step of forming one or more patternable conductive layers over said insulating layer further comprises forming said one or more patternable conductive layers at a temperature less than 350° C.

5. The process of claim 1 wherein said step of forming said one or more patternable conductive layers over said insulating layer further comprises the steps of:
   (a) forming a first conductive layer over said insulating layer;
   (b) depositing a layer of aluminum over said first conductive layer at a deposition temperature of less than 350° C.; and
   (c) forming a third layer over said aluminum layer.

6. The process of claim 1 wherein said step of forming said one or more patternable conductive layers over said insulating layer further comprises the steps of:
   (a) forming a first conductive layer over said insulating layer selected from the group consisting of titanium, titanium-tungsten, and titanium nitride;
   (b) depositing a layer of aluminum over said first conductive layer at a deposition temperature of less than 350° C.; and
   (c) forming a third layer over said aluminum layer selected from the group consisting of titanium, titanium-tungsten, and titanium nitride.

7. The process of claim 1 wherein said step of depositing sufficient aluminum over said structure to fill said one or more vias with aluminum plugs and to form an aluminum layer over said insulating layer further comprises the steps of:
   a) first sputtering aluminum over said structure during a first deposition phase while maintaining a power level equivalent to from about 9 to about 17 kilowatts for a six inch diameter wafer;
   b) then sputtering aluminum over said structure during a second deposition phase while maintaining a power lever equivalent to from about 1 to about 3 kilowatts for a six inch diameter wafer; and
   c) then sputtering aluminum over said structure during a third deposition phase while maintaining a power level equivalent to from about 4 to about 17 kilowatts for a six inch diameter wafer.

8. The process of claim 7 wherein said first deposition phase is carried out for a period of from about 0.1 to about 3.0 minutes.

9. The process of claim 7 wherein said second deposition phase is carried out for a period of from about 0.1 to about 10 minutes.

10. A process of claim 7 wherein said third deposition phase is carried out for a period of from about 0.3 to about 0.4 minutes.

11. The process of claim 7 wherein said first deposition phase is carried out while maintaining said wafer at a temperature of less than about 200° c.

12. The process of claim 7 wherein said second and third deposition phases are carried out while maintaining said wafer at a temperature of from about 400° C. to about 600° C.

13. A process for forming a low resistance aluminum plug in a via in an insulating layer of an integrated circuit structure and a patterned conductive layer over said insulating layer and in electrical connection with said aluminum plug which comprises:
   a) providing an insulating layer having one or more vias therein to underlying portions of said integrated circuit structure;
   b) depositing sufficient aluminum over said structure to f ill said one or more vias with aluminum plugs and to form an aluminum layer over said insulating layer, utilizing a deposition temperature of at least 400° C. or higher for at least a portion of the aluminum deposition;
c) removing said aluminum layer from said surface of said insulating layer, while leaving said aluminum plugs in said one or more vias; and
d) forming one or more patternable conductive layers over said insulating layer and said one or more vias, and in electrical connection with said aluminum plugs, including the formation of an aluminum layer at a temperature of less than 350° C.

14. A process for forming a low resistance aluminum plug in a via in an insulating layer of an integrated circuit structure and a patterned conductive layer over said insulating layer and in electrical communication with said aluminum plug which comprises:
   a) providing an insulating layer having one or more vias therein to underlying portions of said integrated circuit structure;
   b) depositing sufficient aluminum over said structure to fill said one or more vias with aluminum plugs and to form an aluminum layer over said insulating layer, utilizing a deposition temperature of at least 400° C. or higher for at least a portion of the aluminum deposition;
   c) removing said aluminum layer from said surface of said insulating layer, while leaving said aluminum plugs in said one or more vias; and
   d) forming a first patternable conductive layer over said insulating layer selected from the group consisting of titanium, titanium-tungsten, and titanium nitride;
   e) depositing a patternable layer of aluminum over said first conductive layer at a deposition temperature of less than 350° C.; and
   f) forming a third patternable conductive layer over said aluminum layer selected from the group consisting of titanium, titanium-tungsten, and titanium nitride.

15. A process for forming a low resistance aluminum plug in a via in an insulating layer of an integrated circuit structure and a patterned conductive layer over said insulating layer and electrically connected to said aluminum plug which comprises:
   a) providing an insulating layer having one or more vias therein to underlying portions of an integrated circuit structure;
   b) depositing sufficient aluminum over said structure to fill said one or more vias with aluminum plugs and to form an aluminum layer over said insulating layer by the steps of:
      i) sputtering aluminum over said structure during a first deposition phase of from about 0.1 to about 3.0 minutes, while maintaining a power level equivalent to from about 9 to about 17 kilowatts for a six inch diameter wafer, and while maintaining said wafer at a temperature of less than about 200° C.;
      ii) then sputtering aluminum over said structure during a second deposition phase of from about 0.1 to about 10 minutes, while maintaining a power level equivalent to from about 1 to about 3 kilowatts for a six inch diameter wafer, and while maintaining said wafer at a temperature of from about 400° C. to about 600° C.;
      iii) then sputtering aluminum over said structure during a third deposition phase of from about 0.3 to about 0.4 minutes, while maintaining a power level equivalent to from about 4 to about 17 kilowatts for a six inch diameter wafer, and while still maintaining said wafer at a temperature of from about 400° C. to about 600° C.;
   c) removing said aluminum layer from said surface of said insulating layer, while leaving said aluminum plugs in said one or more vias; and
   d) then forming one or more patternable conductive layers over said insulating layer and said one or more vias, and electrically connected to said aluminum plugs therein.

16. A process for forming a low resistance aluminum plug in a via in an insulating layer of an integrated circuit structure and a patterned conductive layer over said insulating layer and in electrical connection with said aluminum plug which comprises:
   a) providing an insulating layer having one or more vias therein to underlying portions of an integrated circuit structure;
   b) depositing sufficient aluminum over said structure to fill said one or more vias with aluminum plugs and to form an aluminum layer over said insulating layer at an aluminum deposition temperature of at least about 400° C. during a portion of said deposition;
   c) removing said aluminum layer from said surface of said insulating layer, while leaving said aluminum plugs in said one or more vias; and
   d) forming, at a temperature of less than about 350° C., one or more conductive layers, including at least one patternable layer of aluminum, over said insulating layer and said one or more vias, and electrically connected to said aluminum plugs therein.

17. A process for forming a low resistance aluminum plug in a via in an insulating layer of an integrated circuit structure and a patterned conductive layer over said insulating layer and in electrical connection with said aluminum plug which comprises:
   a) providing an insulating layer having one or more vias therein to underlying portions of an integrated circuit structure;
   b) depositing, in more than one deposition phase, sufficient aluminum over said structure to fill said one or more vias with aluminum plugs and to form an aluminum layer over said insulating layer, said deposition phases including at least one deposition phase having an aluminum deposition temperature of at least about 400° C.;
   c) removing said aluminum layer from said surface of said insulating layer, while leaving said aluminum plugs in said one or more vias; and
   d) forming, at a temperature of less than about 350° C., at least one patternable layer of aluminum over said insulating layer and said one or more vias, and electrically connected to said aluminum plugs therein.

* * * * *